(12) United States Patent
Shilimkar et al.

(10) Patent No.: US 11,804,527 B2
(45) Date of Patent: Oct. 31, 2023

(54) TRANSISTOR WITH CENTER FED GATE

(71) Applicant: NXP USA, Inc., Austin, TX (US)

(72) Inventors: Vikas Shilimkar, Chandler, AZ (US);
Kevin Kim, Gilbert, AZ (US); Daniel Joseph Lamey, Chandler, AZ (US);
Bruce McRae Green, Gilbert, AZ (US);
Ibrahim Khalil, Gilbert, AZ (US);
Humayun Kabir, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 202 days.

(21) Appl. No.: 17/376,026

(22) Filed: Jul. 14, 2021

(65) Prior Publication Data

US 2023/0019549 A1 Jan. 19, 2023

(51) Int. Cl.
| | |
|---|---|
| *H01L 29/417* | (2006.01) |
| *H01L 29/778* | (2006.01) |
| *H01L 23/00* | (2006.01) |
| *H01L 29/40* | (2006.01) |
| *H01L 23/48* | (2006.01) |

(52) U.S. Cl.
CPC ........ *H01L 29/41775* (2013.01); *H01L 23/481* (2013.01); *H01L 24/05* (2013.01); *H01L 29/401* (2013.01); *H01L 29/7786* (2013.01); *H01L 2224/04042* (2013.01)

(58) Field of Classification Search
CPC ... H01L 23/481; H01L 24/05; H01L 29/41775
See application file for complete search history.

(56) References Cited

U.S. PATENT DOCUMENTS

| | | | | |
|---|---|---|---|---|
| 5,294,814 | A * | 3/1994 | Das | H01L 29/1602 257/E29.255 |
| 6,198,116 | B1* | 3/2001 | Cerny et al. | H01L 21/8252 257/E21.453 |
| 6,229,221 | B1 | 5/2001 | Kloen et al. | |
| 6,765,268 | B2 | 7/2004 | Akamine et al. | |
| 8,021,976 | B2 | 9/2011 | Lee et al. | |
| 11,356,070 | B2* | 6/2022 | Lim et al. | H01L 23/4824 |
| 2004/0070086 | A1 | 4/2004 | Lee et al. | |
| 2005/0285189 | A1* | 12/2005 | Shibib et al. | H01L 29/7835 257/E29.12 |
| 2011/0102077 | A1* | 5/2011 | Lamey et al. | H01L 29/78 327/594 |
| 2016/0315248 | A1* | 10/2016 | Zhu et al. | G11C 11/161 |
| 2017/0141105 | A1* | 5/2017 | Meiser et al. | H03K 17/6871 |
| 2017/0301586 | A1* | 10/2017 | Sio et al. | H01L 29/7851 |
| 2017/0373138 | A1* | 12/2017 | Birner et al. | H01L 21/26513 |

(Continued)

FOREIGN PATENT DOCUMENTS

WO 2018055719 A1* 3/2018 ............... H01L 27/04

OTHER PUBLICATIONS

Salib et al., "A Novel Base Feed Design for High Power, High Frequency Heterojunction Bipolar Transistors," 2001 IEEE MTT-S Digest, WE4A-6, pgs. 1075-1078; 4 pages.

*Primary Examiner* — Mamadou L Diallo

(57) ABSTRACT

A transistor includes a source contact connected to a Through-Silicon Via (TSV). A drain contact is connected to a first pad. A gate structure is interposed between the source contact and the drain contact. A second pad is connected to the gate structure, the second pad comprising a first side diametrically opposed to a second side, and a third side interposed therebetween, the source contact proximal to the third side, a first portion of the first side and a second portion of the second side.

21 Claims, 7 Drawing Sheets

(56) References Cited

U.S. PATENT DOCUMENTS

| | | | | |
|---|---|---|---|---|
| 2019/0097043 | A1* | 3/2019 | Tominaga et al. | H01L 29/42376 |
| 2020/0083215 | A1* | 3/2020 | Ichijo et al. | H01L 23/528 |
| 2020/0343352 | A1* | 10/2020 | Trang et al. | H01L 29/41725 |
| 2021/0066310 | A1* | 3/2021 | Liaw | H01L 21/823828 |
| 2022/0020874 | A1* | 1/2022 | Fisher et al. | H01L 29/0696 |
| 2022/0037336 | A1* | 2/2022 | Yang | H01L 27/0207 |
| 2022/0093740 | A1* | 3/2022 | Paul | H01L 21/823425 |
| 2022/0109054 | A1* | 4/2022 | Togo | H01L 29/41766 |
| 2022/0115297 | A1* | 4/2022 | Shilmkar et al. | H01L 23/552 |
| 2022/0216131 | A1* | 7/2022 | Lee et al. | H01L 23/49822 |
| 2022/0223700 | A1* | 7/2022 | Bothe et al. | H03F 3/195 |
| 2022/0352326 | A1* | 11/2022 | Huang et al. | H01L 29/0673 |
| 2023/0018869 | A1* | 1/2023 | Chuang et al. | H01L 21/823487 |

* cited by examiner

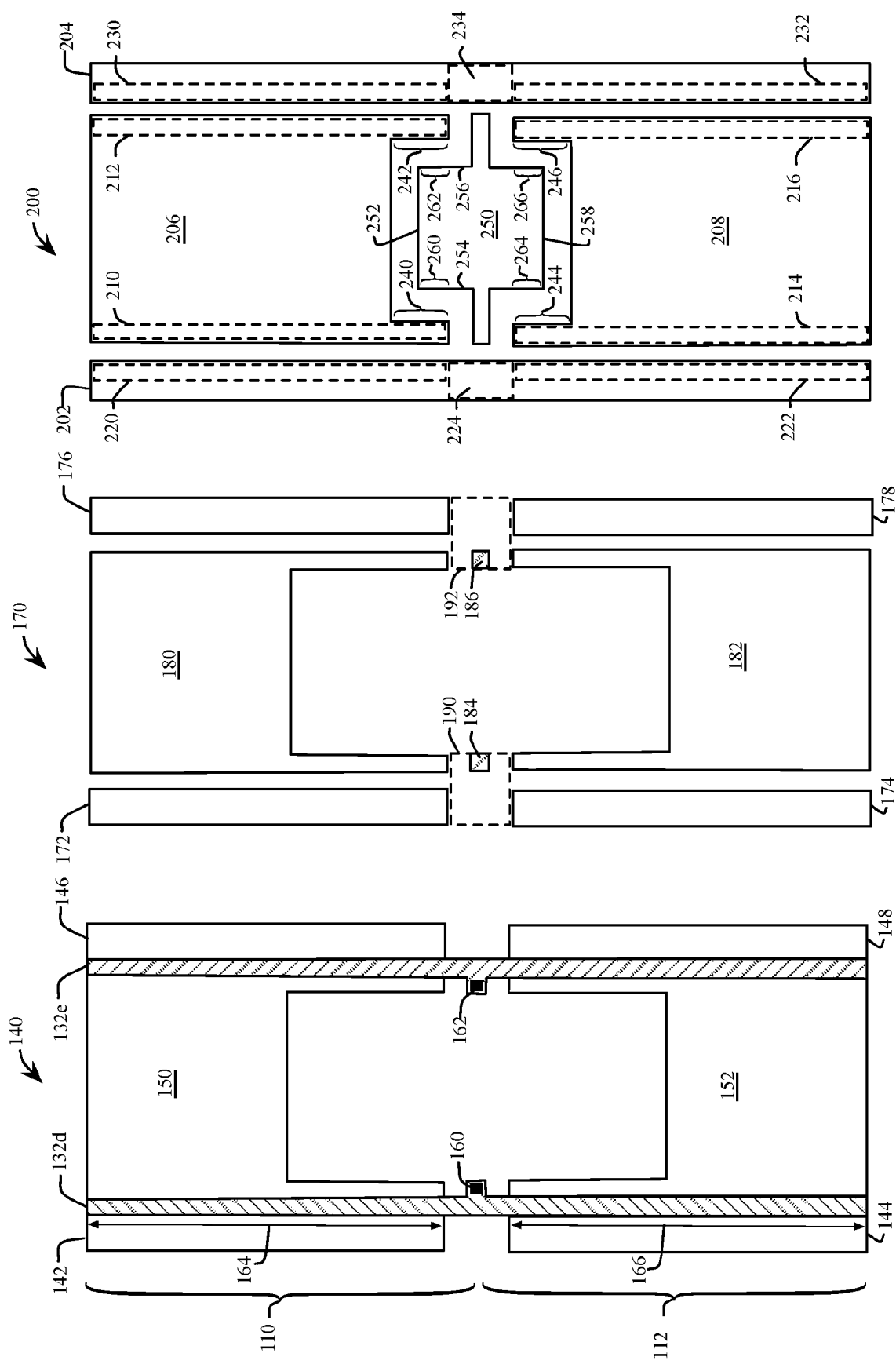

TRANSISTOR WITH CENTER FED GATE

FIELD

This disclosure relates generally to transistors, and more specifically to III-N transistors (e.g., a Gallium Nitride (GaN) device).

BACKGROUND

High power applications benefit from using longer unit gate width transistors. While longer unit gate widths provide for higher power density, increasing the unit gate width of a transistor undesirably reduces large-signal gain due to an increase in gate resistance. Wide gate widths may further increase the aspect ratio of a semiconductor die having multiple parallel transistor structures (e.g., transistor fingers). A high aspect ratio die is generally less area efficient, compared to a die with a lower aspect ratio having similar length and width dimensions. A high aspect ratio die may also have inferior thermal performance and reduced assembly yield, particularly from the die pick and package attachment processes.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 is a plan view of a first metal layer and a gate metal layer corresponding to one pair of the transistor fingers of FIG. 4, in accordance with an example embodiment of the present disclosure.

FIG. 6 is a plan view of a second metal layer corresponding to one pair of the transistor fingers of FIG. 4, in accordance with an example embodiment of the present disclosure.

FIG. 7 is a plan view of a metal layer corresponding to one pair of the transistor fingers of FIG. 4, in accordance with an example embodiment of the present disclosure.

DETAILED DESCRIPTION

Figure 1:
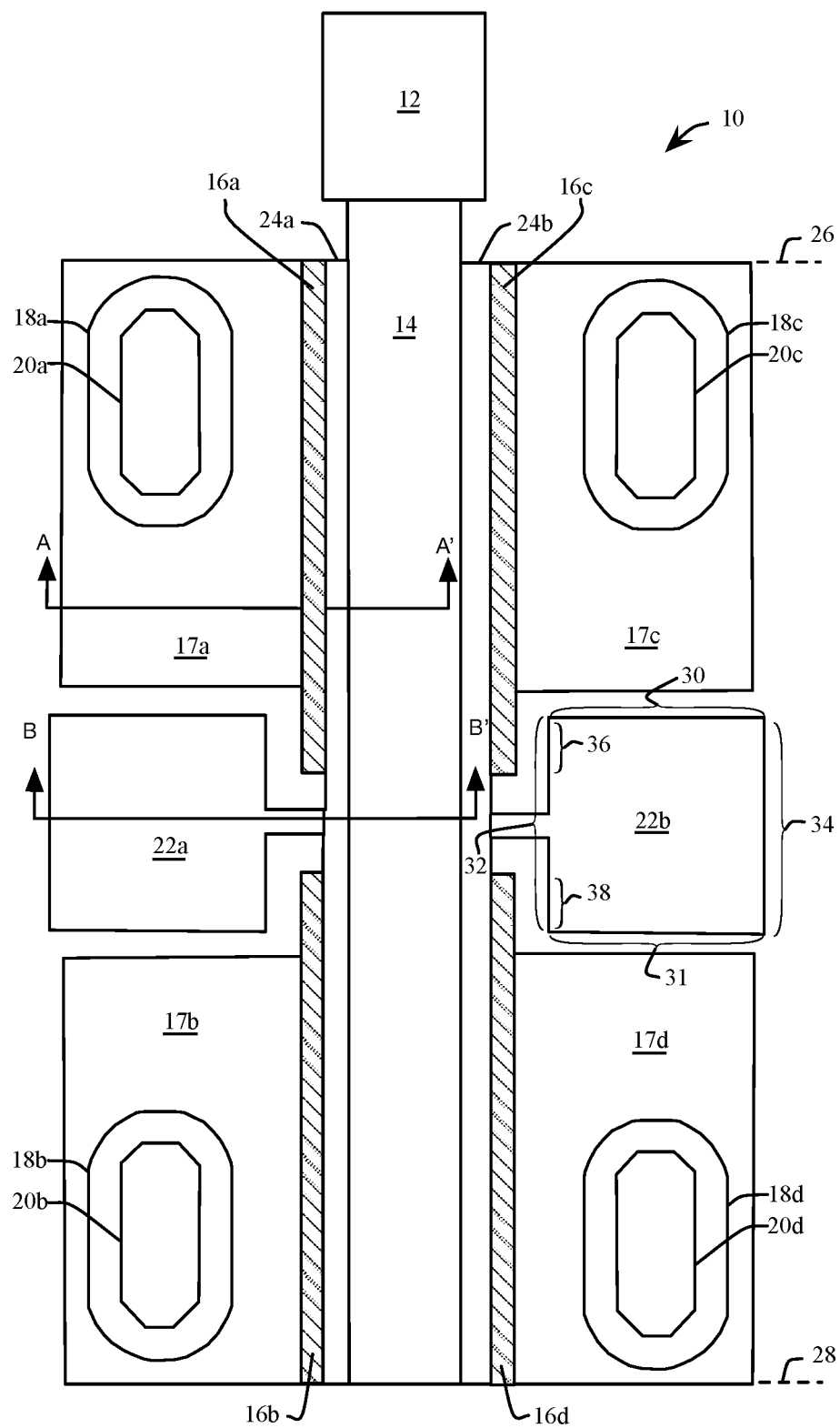
FIG. 1 is a plan view of the functional regions of two transistor fingers, in accordance with an example embodiment of the present disclosure.

Embodiments described herein provide for improvements in the large-signal gain of Radio Frequency (RF) transistors, including but not limited to high-power density transistors such as III-N High Electron Mobility Transistors (HEMT). Specifically, improvements in gain are realized by lowering the parasitic gate resistance of the transistor with a novel gate attachment pad (or gate pad). In one embodiment, the gate pad is a wire bond pad. In another embodiment, the gate attachment pad is suitable for attachment of a solder bump or conductive pillar for flip chip attachment. The gate pad is designed to couple to a "center feed point" of the transistor gate width (e.g., a location between first and second ends of the transistor gate, such as at or near the center of the transistor gate width), while maintaining a space efficient layout. Driving the gate at or near a center point essentially results in two parallel gates, each having about half the width of some embodiments of a conventional gate that lacks the center fed arrangement. In some embodiments, the center feed point is halfway along the conventional gate width. In other embodiments, the center feed point is located substantially at a mid-point of the conventional gate width but may vary from 50% (e.g., 40% or 60%) along the gate width while still realizing improvements in gain. In still other embodiments, the center feed point may be located at any location between the distal ends of the entire gate width.

Coupling the gate pad at a center feed point requires a novel layout arrangement further described in this disclosure. Specifically, the source metallization (e.g., the overlying metal connections to the source contact of the transistor) may include a void or notch to allow room for the gate pad on the same surface plane as one of the source metallization layers (e.g., the gate pad may be formed from a same metal layer). In addition, a narrow region of the source metallization may be formed, whose potential effects on electromigration are mitigated. In one embodiment, the gate pad is specifically arranged to be over an "inactive region" of the transistor to reduce eddy current losses otherwise associated with a conductive substrate. In another embodiment, the drain contact is partitioned into two drain contacts with a void proximal to a connection between the gate pad and the gate to reduce drain to gate parasitic capacitance. Further benefits are realized by the center fed gate structure by improving the layout aspect ratio of the diced substrate (e.g., dice). By shortening the physical length of each portion of the gate contact, the resulting dice are able to be formed with a more square aspect ratio thus potentially improving thermal performance and the package assembly process.

In various embodiments, the transistors described herein are III-N (e.g., III-V) transistors formed on a multi-layer substrate including an Aluminum Gallium Nitride (AlGaN) barrier layer over a GaN buffer and channel over a silicon carbide (SiC) substrate. The substrate may include a Two-Dimensional Electron Gas (2DEG) in a portion of the transistor, and in response to a gate voltage, a channel in the substrate becomes variably-conductive and bidirectional between the source and drain contacts. As used herein, an "active" area of the transistor includes the source, gate, and drain contacts and the underlying areas of the substrate. Areas of the substrate outside the "active" area (e.g., where variably-conductive channels are not present) are referred to as "inactive" areas. These may include high-resistivity areas, which may be rendered highly resistive through various means such as the implantation of an Oxygen species.

FIG. 1 shows a top view of an example embodiment of the functional regions of a pair of parallel transistor fingers that form a portion of a transistor 10 that includes a first side 26 and a second side 28. The term "fingers" as used throughout this disclosure is defined as a combination of adjacent source, gate and drain structures, which can be used as individual transistors or combined in parallel with other fingers to form the transistor. A conductive drain pad 12 is electrically coupled to an elongated drain contact 14 (e.g., drain contact 64, FIG. 2). The drain contact 14 is "elongated" in that it has a first elongated shape. In one example embodiment, the drain contact 14 is within the active area of a III-N semiconductor substrate (e.g., active area 65, FIG. 2). A plurality of elongated source contacts 16a, 16b, 16c and 16d (generally 16) (e.g., source contact 62, FIG. 2) are also within the active area. The source contacts 16 are "elongated" in that they have a second elongated shape. In the illustrated embodiment, source contacts 16a and 16b are colinear and disposed on a first side of the drain contact 14. Thus, source contacts 16a, 16b may be considered to be a single, first source contact with a first end proximate to the first side 26, a second end proximate to the second side 28, and a central gap between the first and second ends of the first source contact. The central gap is proximate to the below-described gate pad 22a (or more specifically, the central gap in the first source contact underlies the conductive extension 90 (FIG. 3) coupled between the gate pad 22a and the gate 24a). Similarly, source contacts 16c and 16d are colinear and disposed on a second side of the drain contact 14. Thus, source contacts 16c, 16d also may be considered to be a single, second source contact with a first end proximate to the first side 26, a second end proximate to the second side 28, and a central gap between the first and second ends of the second source contact. The central gap in the second source contact is proximate to the below-described gate pad 22b. In an alternate embodiment, the source contact gaps may be excluded, and each of the source contacts may extend the full length of the drain contact. Each of the source contacts 16 are coupled through a section of overlying source metallization 17a, 17b, 17c, 17d (generally 17) (e.g., portions of metal layer 74, FIG. 2) to a respective Through-Substrate Via (TSV), each of which extends through the semiconductor substrate to the back side of the substrate. Each TSV may include a respective insulator 18a, 18b, 18c and 18d (generally 18) surrounding a respective conductor 20a, 20b, 20c and 20d (generally 20). The source metallization 17 and each TSV electrically connects a respective source contact 16 to a conductor or electrical attachment point (e.g., a conductive layer) on the back side of the substrate. The drain and source contacts 14, 16 extend in parallel with each other.

A gate pad 22a (e.g., pad 22a of FIG. 3) is electrically coupled to an elongated gate structure 24a (e.g., gate structure 66, FIG. 2) interposed between the elongated drain contact 14 and an elongated source contacts 16a and 16b. Similarly, a gate pad 22b is electrically coupled to an elongated gate structure 24b interposed between the drain contact 14 and elongated source contacts 16c and 16d. The drain contact 14 and the source contact 16 are elongated structures extending parallel to each other and disposed between a first side 26 and a second side 28 of the transistor 10. Each of the gate pads 22a and 22b (generally 22) and their connections to their respective gate structures 24a and 24b (generally 24) are formed over inactive areas, while the gate structures 24 are formed in active areas. Beneficially, positioning the gate pads 22 over inactive areas reduces losses in the gate signal applied to the gate structures 24 by reducing underlying eddy currents in the substrate that may otherwise magnetically couple into the gate structures 22. Similarly, gate signals applied to the gate structures 22 could magnetically couple into an underlying 2DEG region if the gate structures 22 were not shielded by an inactive area. In one embodiment, the drain contacts 14 and the source contacts 16 are formed between and extend between a first side 26 and a second side 28 (or output side and input side) of a top surface of a semiconductor substrate. In one embodiment, electrical attachments from other components of a package or another substrate are made to the drain pad 12 and gate pads 22 using wiring bonding techniques. In other embodiments, solder bumps or conductive pillars are applied to the drain pad 12 and gate pads 22 for attachment to a package or another substrate (e.g., using a flip-chip configuration).

In the example embodiment 10, the gate pad 22b has a rectangular shape, which includes a third side 32 opposite a fourth side 34, both of which are perpendicular to the first and second sides 26, 28, and a fifth side 30 opposite a sixth side 31 interposed therebetween, which are parallel to the first and second sides 26, 28. The source metallization 17c is proximal to the fifth side 30 and a first portion 36 of the third side 32. The source metallization 17d is proximal to the sixth side 31 and a second portion 38 of the third side 32.

Figure 2:
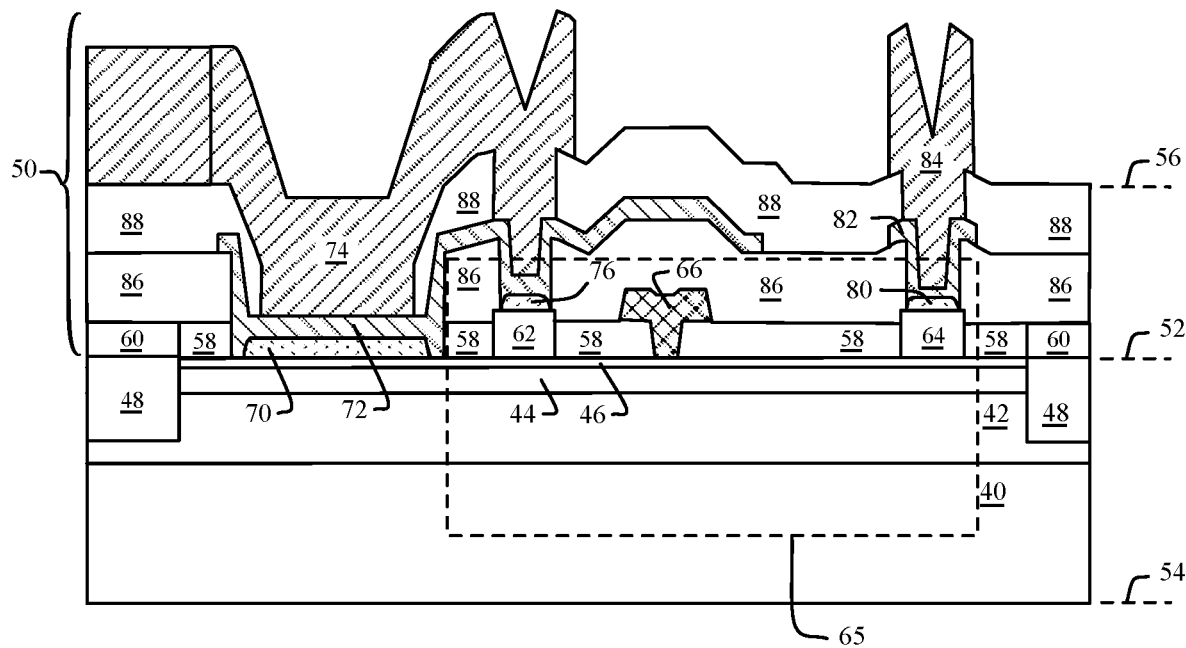
FIG. 2 is a cross-sectional view of FIG. 1, taken along A-A', illustrating the interior of a transistor.

FIG. 2 with continued reference to FIG. 1, shows a cross-sectional view of the example embodiment 10 taken along A-A' showing the interior of a transistor. When the transistor is a GaN transistor, the formation of the transistor may start with a Silicon Carbide (SiC) substrate 40. A GaN buffer layer 42 is formed over the SiC substrate 40. In one embodiment, a seed or nucleation layer (not shown) is formed between the SiC substrate 40 and the GaN buffer/channel layer 42 to transition the crystal lattice of the SiC layer 40 to the GaN layer 42. In another example embodiment, the substrate is Silicon (Si) and the seed layer is Aluminum Nitride (AlN), although other III-N combinations are envisioned within the scope of this disclosure. An AlGaN barrier layer 44 is formed over the GaN buffer layer 42 resulting in piezoelectric polarization with an abundance of electrons being generated just below the AlGaN layer 44 that is highly conductive. This abundance of electrons forms the 2DEG layer. A cap layer 46 is formed over the AlGaN layer 44 to form a protective layer to protect the underlying epitaxial layers from subsequent wafer processing. An isolation region 48 is formed (in one example by Oxygen implantation), to inactivate and thus form inactive regions where underlying transistor operation is not desired.

A build-up structure 50 is formed over a first top surface 52 of the underlying semiconductor substrate layers including the cap layer 46, the AlGaN layer 44, the GaN buffer/channel layer 42 and the SiC substrate 40. The SiC substrate has a bottom surface 54, which opposes the first top surface 52. The build-up structure 50 extends between the first top surface 52 and a second top surface 56, wherein the second top surface 56 defines the surface formed during the last Back End Of Line (BEOL) step, typically where pad areas are exposed for connections during a package assembly process.

In one example embodiment, the build-up structure 50 includes a Low Pressure Chemical Vapor Deposition (LPCVD) deposited layer 58 over the cap layer 46. A region 60 results from the LPCVD-deposited layer being altered during the implantation of the isolation region 48. Conductive ohmic contacts 62 and 64 (e.g., source and drain contacts, such as contacts 12 and 16 of FIG. 1) are formed on the cap layer 46 through openings in layer 58 to provide low impedance connections to source and drain regions of the underlying substrate, respectively. A conductive gate contact 66 is deposited on the cap layer 46 through an opening in layer 58 to form a low impedance gate connection between the source and drain regions. A variable gate voltage applied to the gate structure 66 controls the formation and disbursement of the electrons in the 2DEG layer.

A first metal layer 70 (M0) is formed on the cap layer 46 through an opening in layer 58, and portions of metal layer 70 connect to TSVs (see FIG. 1 TSV conductor 20). A second metal layer 72 (M1) is formed over the first metal layer 70. In some embodiments, the first metal layer 70 and the second metal layer 72 are also referred to as a Field Plate (FP) and a Catch Pad (CP) respectively. A top metal layer 74 (also referred to herein as "source metallization") is formed over the second metal layer 72. Referring again to FIG. 1, portions of the top metal layer 74 form source metallization 17, and in some embodiments, other portions of the top metal layer 74 form gate pads 22. In a three metal layer process the top metal layer 74 is considered third metal layer (M2), although structures with additional metal layers (e.g., metal layers between M1 and the top metal layer) may also realize the benefits of this disclosure. The top metal layer 74 is relatively thick compared to the underlying first metal layer 70 and the second metal layer 72. A first metal layer 76 is deposited over the ohmic contact 62 and further connects to the top metal layer 74 though the second metal layer 72, thereby connecting the source contact 62 to one or more TSVs (e.g., TSV conductor 20 of FIG. 1). Similarly, a first metal layer 80 connects to the ohmic drain contact 64, a second metal layer 82 connects to the first metal layer 80 and a top metal layer 84 connects to the second metal layer 82, thereby forming a drain connection. Interlayer dielectric (ILD) layers 86 and 88 are formed to further separate the plurality of metal layers. The source, drain, and gate contacts 62, 64, 66 and underlying areas of the substrate comprise the "active area" 65 of the transistor, according to an embodiment, whereas portions of the substrate outside of the "active area" are considered to be "inactive areas" of the transistor, as those terms are used herein.

Figure 3:
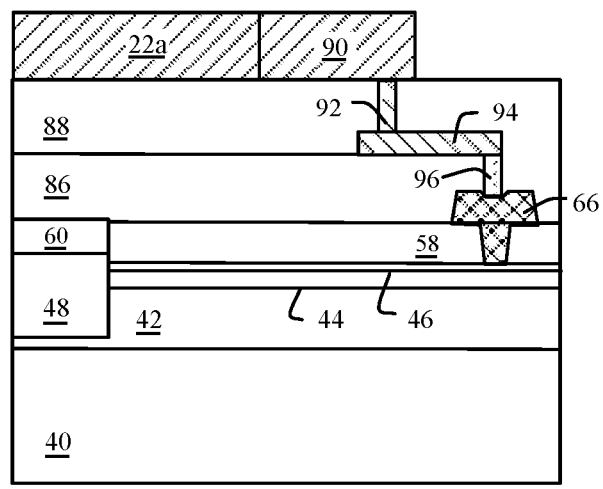
FIG. 3 is a cross-sectional view of FIG. 1, taken along B-B', illustrating a gate connection of the transistor.

FIG. 3 with continued reference to FIG. 1 and FIG. 2, shows a cross-sectional view of the example embodiment 10 taken along B-B' showing the gate connection of the transistor. The gate connection includes gate pad 22a, a conductive bridging section 90, a first conductive via 92 (e.g., formed as part of the top metal layer 74), a portion of the second metal layer 94, a portion of the first metal layer 96, and the gate contact 66. According to an embodiment, the gate pad 22a and the bridging section 90 are formed from the same metal layer as the source metallization 17 (e.g., metallization layer 74), although the gate pad 22a and the bridging section 90 are electrically isolated from the source metallization 17 with gaps in the metallization layer 74, as best shown in FIG. 1. The gate pad 22a desirably overlies an inactive region of the transistor, as discussed previously. As also best shown in FIG. 1, the bridging section 90 may be a relatively narrow conductive bridge that extends over the source contact (e.g., over the central break between source contact 16a, 16b, 62, FIGS. 1, 2) to make contact with the first via 92. The first via 92 extends through the ILD layer 88 to make contact with the portion of the second metal layer 94, which in turn makes contact with the portion of the first metal layer 96. The portion of the first metal layer 96 extends through the ILD layer 86 to make electrical contact with the gate contact 66.

Figure 4:
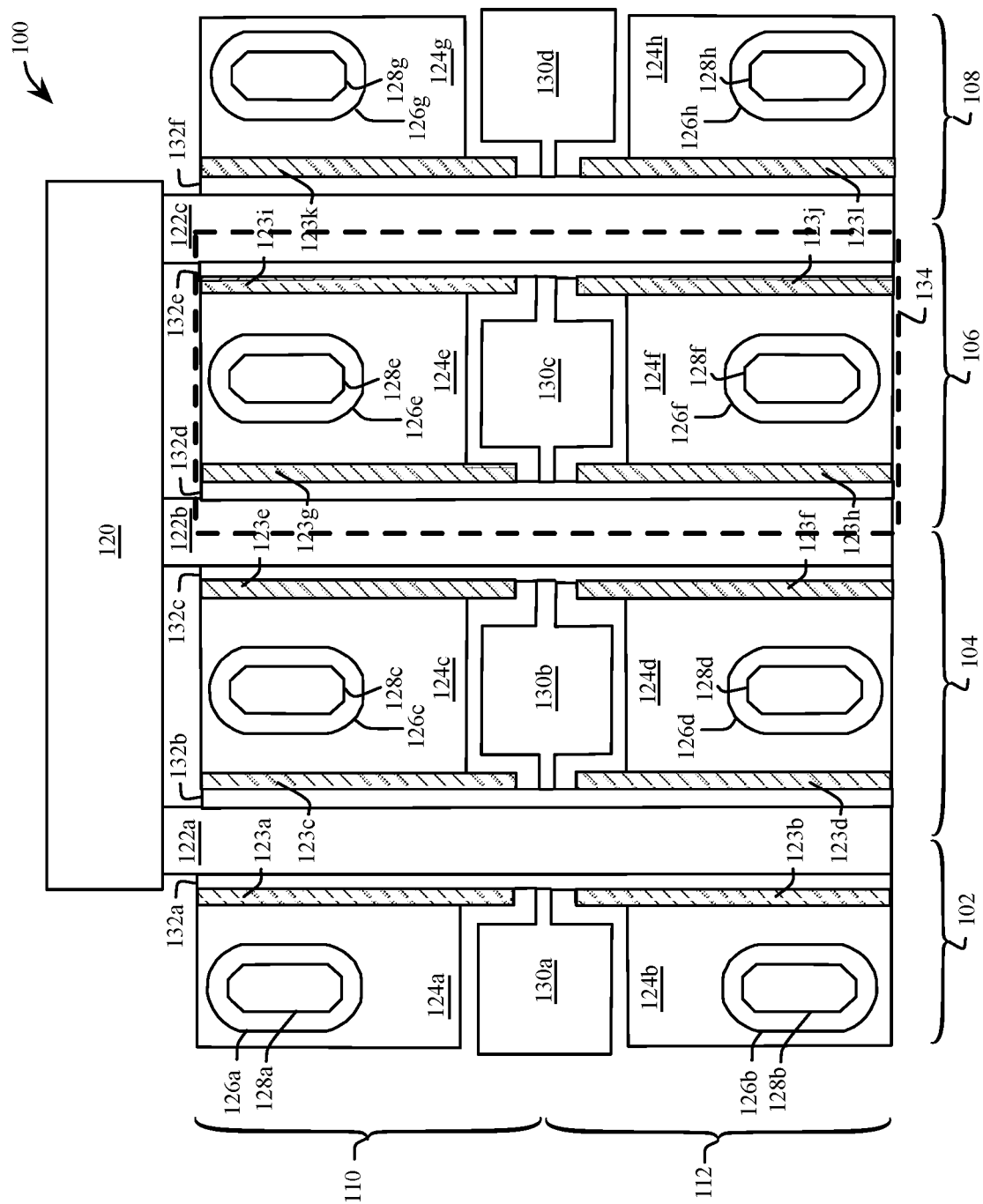
FIG. 4 is a plan view of the functional regions of six transistor fingers, in accordance with an example embodiment of the present disclosure.

FIG. 4 shows a plan view of an example embodiment 100 of the functional regions of four pairs of transistor fingers. In the example embodiment 100, a first transistor finger 102, a second transistor finger 104, a third transistor finger 106 and a fourth transistor finger 108, each include an upper half 110 and a lower half 112. A drain pad 120 is electrically coupled to a first drain contact 122a, a second drain contact 122b and a third drain contact 122c (generally 122). Each of the drain contacts is within an active region of the transistor. Similar to FIG. 1, the example embodiment 10 includes a plurality of elongated source contacts 123a to 123l (generally 123), each within an active region. Each of the source regions 124 is coupled through a section of overlying source metallization 124a, 124b, 124c, 124d, 124e, 124f, 124g and 124h (generally 124) (e.g., portions of metal layer 74, FIG. 2) to a respective TSV, each of which extends through the semiconductor substrate to the back side of the substrate. Each TSV may include a respective insulator 126a, 126b, 126c, 126d, 126e, 126f, 126g and 126h (generally 126) surrounding a respective conductor 128a, 128b, 128c, 128d, 128e, 128f, 128g and 128h (generally 128). Each TSV connects a respective source contact 123 to a conductor or electrical attachment point (e.g., a conductive layer) on the back side of the substrate.

A gate pad 130a is electrically coupled to a gate 132a interposed between the drain contact 122a and a respective pair of source contacts 123a and 123b. In contrast the example embodiment 10 of FIG. 1, the embodiment 100 of FIG. 4 also includes gate pads shared with (e.g., electrically coupled to) the two gates for the second transistor finger 104 and the third transistor finger 106, with consequential improvements in layout density. Specifically, a gate pad 130b is electrically coupled to a gate 132b interposed between the drain contact 122a and source contacts 123c and 123d. The gate pad 130b is also electrically coupled to a gate 132c interposed between a drain contact 122b and source contacts 123e and 123f. Similarly, a gate pad 130c is electrically coupled to a gate 132d interposed between the drain contact 122b and a source contacts 123g and 123h. The gate pad 130c is also electrically coupled to a gate 132e interposed between the drain contact 122c and source contacts 123i and 123j. Similar to the first transistor finger 102, the fourth transistor finger 108 includes a gate pad 130d electrically coupled to a gate 132f interposed between the drain contact 122c and source contacts 123k and 123l. Similar to the embodiment 10 of FIG. 1, each of the source contacts 123, the drain contacts 122a, 122b and 122c (generally 122), and the gates 132a, 132b, 132c, 132d, 132e and 132f (generally 132) are formed over active areas, while the gate pads 130a, 130b, 130c and 130d (generally 130), portions of the source metallization 124, and the respective connections therebetween, are formed over inactive areas.

In the example embodiment 100, four transistors fingers 102, 104, 106 and 108 are shown for the purpose of illustrating functional regions and the coupling between such regions. It should be appreciated that alternative embodiments may have a different number of transistor fingers while still realizing the benefits of this disclosure. In an example embodiment, the drain pad 120 and each of the gate pads 130 may be electrically connected to other components or within a package or to another substrate with respective wire bonds. In other example embodiments, the drain pad 120 and each of the gate pads 130 are connected to a package or another substrate through solder bumps or conductive pillars in a flip chip assembly. The embodiment 100 of FIG. 4 shows drain contact 122 and source contacts 123, whereby the source contacts 123 are connected to respective TSVs for further attachment on the back side of the substrate (e.g., on the bottom surface 54 of FIG. 2). In another embodiment, the drain contacts and source contacts are transposed, such that the pad 120 and contacts 122 are connected to source regions of the substrate, and the contacts 123 are connected to drain regions of the substrate. The respective source contacts 123 and respective gate pads 130 align vertically (e.g. source contact 123a, source contact 123b and gate pad 130a) to ensure good layout density. The dotted area 134 of the third transistor finger 106 is further illustrated with an illustration of the physical mask layers in FIG. 5, FIG. 6 and FIG. 7.

FIG. 5 with reference to FIG. 2, FIG. 3, and FIG. 4 shows a plan view of an example embodiment 140 including a first metal layer (e.g., M0) and gate contacts 132d, 132e of the third transistor finger 106 as shown in the dotted area 134 of FIG. 4. In the example embodiment 140, portions of the first metal layer 142 and 144 (e.g., metal layer 80) connect to two respective portions of a first elongated ohmic drain contact 64 (see FIG. 2), and more specifically to first and second portions of drain contact 122b. Similarly, other portions of the first metal layer 146 and 148 (e.g., metal layer 80) connect to two respective portions of a second elongated ohmic drain contact 64 (see FIG. 2), and more specifically to first and second portions of drain contact 122c. Accordingly, the functional drain area of each drain contact 122b, 122c is split into first and second drain areas to reduce capacitive coupling between the drain and associated gate, thereby improving the electrical performance of the transistor. The embodiment 140 further includes portions of first metal layers 150 and 152 over and electrically respectively coupled to first source regions 123g and 123i, and to second source regions 123h and 123j (not shown in FIG. 5). A gate contact 132d is defined between the first metal layers 142 and 150 and between the respective first metal layers 144 and 152. Similarly, a gate metal layer 132e is defined between the first metal layers 146 and 150 and between the first metal layers 148 and 152. The gate metal layers 132d and 132e are similar to the gate metal 66 shown in FIG. 2. The gate metal layers 132d and 132e connect to first metal layers 160 and 162 respectively. The first metal layers 160 and 162 are similar to the first metal layer 96 of FIG. 3.

In the example embodiment 140, the first metal layers 150 and 152 are separated from the first metal layers 160 and 162, (similar to the separation of the first and second metal layers 164 and 166 and the first and second metal layers 146 and 148). This separation further improves the electrical performance of the HEMT device by reducing source to gate capacitive coupling. The first metal layers 142, 150 and 146 each have a first length 164 and define the upper half 110 of the third transistor 106. The first metal layers 144, 152 and 148 each have a second length 166 and define the lower half 112 of the third transistor 106. In example embodiments, the electrical resistance of the gate metal 132d and the gate metal 132e are each minimized (and thus optimized) when the first length 164 is equal to the second length 166. In other embodiments, the first length 164 is substantially similar to the second length 166 but not the same. For example, a first length 164 being 90% of the second length 166 will still realize some of the benefits of this disclosure, albeit not optimized.

FIG. 6 with reference to FIG. 2, FIG. 4 and FIG. 5 shows a plan view of an example embodiment 170 including a second metal layer (e.g., M1) of the third transistor finger 106 as shown in the area 134 of FIG. 4. In the example embodiment 170, the second metal layers 172 and 174 are electrically coupled to respective first metal layers 142 and 144 (corresponding to the second metal layer 82 of FIG. 2). Similarly, the second metal layers 176 and 178 are electrically coupled to respective first metal layers 146 and 148. The second metal layers 180 and 182 are electrically coupled to respective first metal layers 150 and 152 (corresponding to the second metal layer 72 of FIG. 2). The second metal layers 184 and 186 (e.g. layer 94 of FIG. 3) are electrically coupled to respective first metal layers 160 and 162 (e.g. layer 96 of FIG. 3). Inactive regions 190 and 192 are shown between the first and second drain and first and second source regions. The inactive regions 190 and 192 are also under the first metal layers 160 and 162 and second metal layers 184 and 186, where the gate pads 130 connect to respective gates 132 (see also FIG. 4).

FIG. 7 with reference to FIG. 2 through FIG. 6 shows a plan view of an example embodiment 200 including a top metal layer of the third transistor finger 106 as shown in the area 134 of FIG. 4. In the example embodiment 200, the top metal layer 202 is electrically coupled to second metal layers 172 and 174 (corresponding to the top metal layer 84 of FIG. 2). Similarly, the top metal layer 204 is electrically coupled to second metal layers 176 and 178. The top metal layers 206 and 208 are electrically coupled to respective second metal layers 180 and 182 (corresponding to the top metal layer 74 of FIG. 2). The regions 210 and 212 correspond to the underlying ohmic contact regions (see 62 of FIG. 2), forming a source terminal where bilateral conduction occurs with a corresponding drain terminal. Bilateral conduction occurs using the 2DEG as the conduction medium. Similarly, the regions 214 and 216 correspond to the underlying ohmic contact regions (see 62 of FIG. 2), forming another source terminal where bilateral conduction occurs with a corresponding drain terminal.

The regions 220 and 222 correspond to the underlying ohmic contact regions (see 64 of FIG. 2), forming drain terminals where bilateral conduction occurs with corresponding source terminals in the regions 210 and 214 respectively. A top metal bridge 224 electrically couples the regions 220 and 222. Similarly, the regions 230 and 232 correspond to the underlying ohmic contact regions (see 64 of FIG. 2), forming drain terminals where bilateral conduction occurs with corresponding source terminals in the regions 212 and 216 respectively. A top metal bridge 234 electrically couples the regions 230 and 232. Separating the regions 220 and 222 defining drain terminals, separating the first metal regions 142 and 144, and separating the second metal regions 172 and 174, while joining the drain regions of the upper half 110 and lower 112 only by the top metal layer bridge 224 advantageously reduces the drain to gate coupling, thereby improving the performance of the HEMT device. Similarly, separating the regions 230 and 232 (defining drain terminals), separating the first metal regions 146 and 148, and separating the second metal regions 176 and 178, while joining the drain regions of the upper half 110 and lower 112 only by the top metal layer bridge 234 further reduces the drain to gate coupling. Furthermore, the drain portions that are removed between the regions 220 and 222, as well as between the regions 230 and 232 have minimal impact on channel resistance due to the narrowing of the source regions at the stubs 240, 242, 244 and 246.

Figure 8:
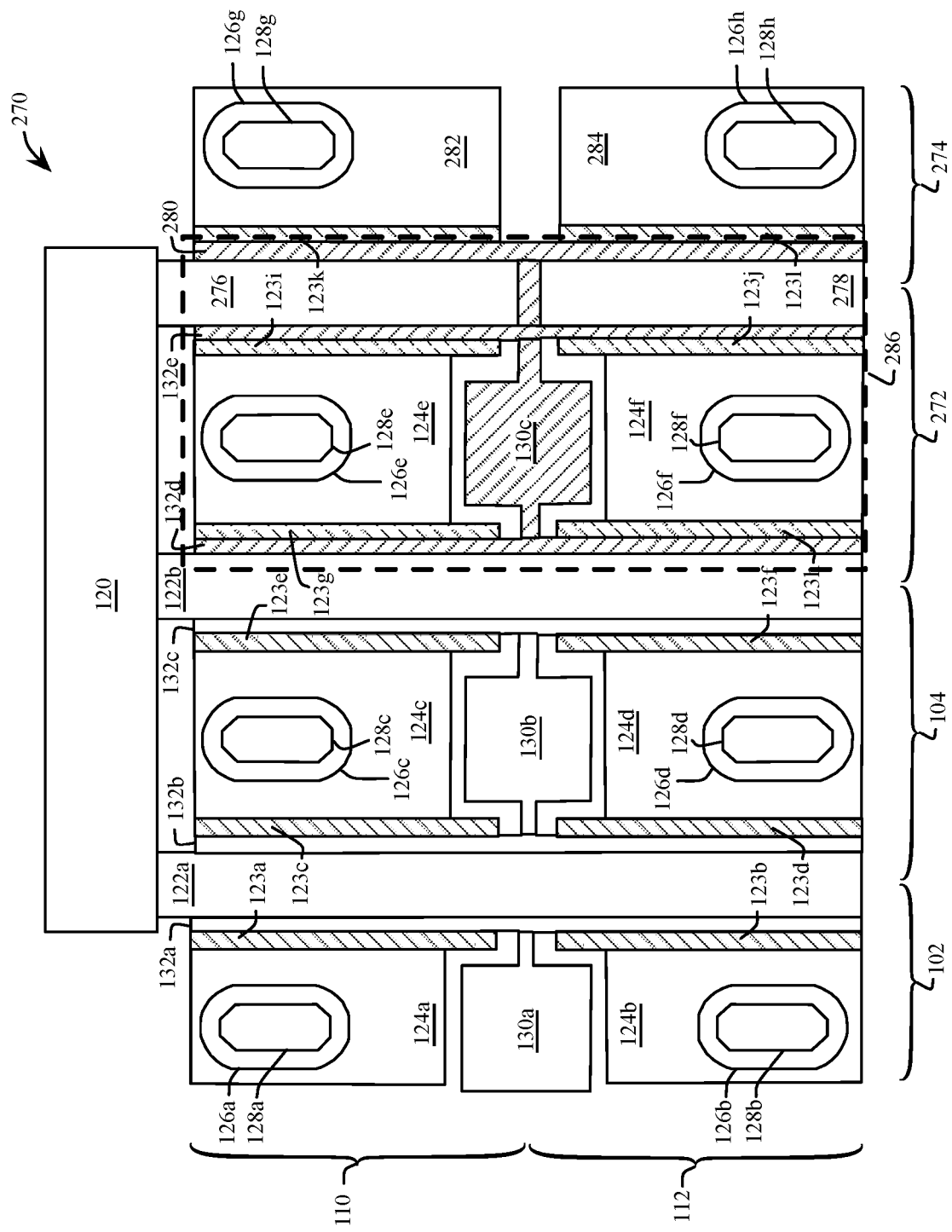
FIG. 8 is another example embodiment of the functional regions of FIG. 4.

The top metal layer portion 206, corresponding to the source metallization 124e of FIG. 8, includes conductive stubs 240 and 242 or extensions. Similarly, the top metal layer portion 208, corresponding to the source metallization 124f of FIG. 8, includes stubs 244 and 246 or extensions. In the embodiment 200, the stubs 240, 242, 244 and 246 are adjacent to voids or notches formed in the respective portions of source metallization 124e and 124f to permit room for the gate pad 250, thereby improving layout density. The gate pad 250 includes a side 252 interposed between sides 254 and 256, where the side 254 is opposite the side 256.

The gate pad 250 further includes a side 258 opposite the side 252. The gate pad 250 includes portions 260 and 262 each proximal to respective stubs 240 and 242. Similarly, the gate pad 250 includes portions 264 and 266 each proximal to respective stubs 244 and 246. Electromigration concerns due to current crowding at the narrow stubs 240 and 242, are mitigated by shunting the stub areas 240 and 242 with each of the metal layers 150, 180 and 206. Similarly, electromigration concerns due to current crowding at the narrow stubs 244 and 246, are mitigated by shunting the stub areas 244 and 246 with each of the metal layers 152, 182 and 208. In one example embodiment, the plan view shape of the top metal layers 206 and 208 is substantially the same as the respective first metal layers 150 and 152 or the respective second metal layers 180 and 182. In another example embodiment, the plan view shape of the first metal layers 150 and 152 and/or the second metal layers 180 and 182 is substantially the same as the respective top metal layers 206 and 208.

FIG. 8 shows a plan view of an example embodiment 270 of the functional regions of four transistor fingers. The example embodiment 270 of FIG. 8, in comparison to FIG. 4, includes a modified third transistor finger 272 and a modified fourth transistor finger 274. The transistor finger 272 includes a first drain contact 276 and a second drain contact 278. In contrast to the embodiment 100 of FIG. 4, the gate pad 130c of the embodiment 270 of FIG. 8 is now electrically coupled to both the gate 132e and the gate 280, wherein the drain contacts 276 and 278 are interposed between the gates 132e and 280. A small increase in the resistance between the gate pad 130c and the gate 280 may occur. However, with this arrangement, a dedicated gate pad is no longer required for the fourth transistor finger 274. In contrast to the fourth transistor finger 108 in the embodiment 100 of FIG. 4, the fourth transistor finger 274 of FIG. 8 no longer requires a dedicated gate pad. Accordingly, the source metallization 282 and 284 are extended towards each other (e.g., are closer together) to potentially lower the channel resistance of the fourth transistor finger 274. In one embodiment, the source metallization 282 and 284 are merged into a single metallization section. The dotted area 286 of the third transistor finger 272 is further illustrated with an illustration of physical mask layers in FIG. 9.

Figure 9:
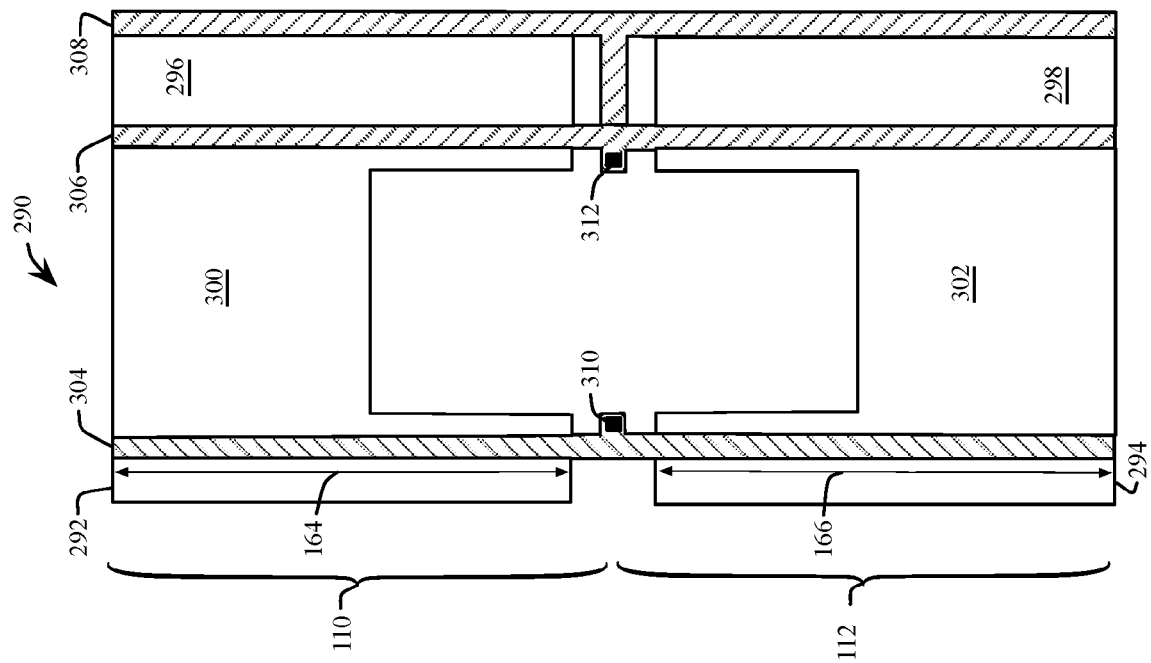
FIG. 9 a plan view of an example embodiment of a first metal layer and a gate corresponding to one pair of the transistor fingers of FIG. 8.

FIG. 9 with reference to FIG. 2, FIG. 3, FIG. 5 and FIG. 8 shows a plan view of an example embodiment 290 including a first metal layer and a gate metal of the third transistor finger 272 as shown in the dotted area 286 of FIG. 8. In the example embodiment 290, the first metal layers 292 and 294 connect to a respective ohmic contact 64 (see FIG. 2) to define respective first and second drain regions within the functional drain region 122b. Similarly, the first metal layers 296 and 298 connect to respective ohmic contacts 64 (see FIG. 2) to define respective first and second drain regions within the respective functional drain regions 276 and 278. The embodiment 290 further includes first metal layers 300 and 302 over respective first and second source regions 124e and 124f. A gate metal layer 304 is defined between the first metal layers 292 and 300 and between the respective first metal layers 294 and 302. Similarly, a gate metal layer 306 is defined between the first metal layers 296 and 300 and between the respective first metal layers 298 and 302. A gate metal layer 308 is further defined and electrically coupled to the gate metal layer 306. The gate metal layers 304, 306 and 308 are similar to the gate metal 66 shown in FIG. 2. The gate metal layer 304 connect to a first metal layer 310. The gate metal layers 306 and 308 connect to a first metal layer 312. The first metal layers 310 and 312 are similar to the first metal layer 96 of FIG. 3.

Figure 10:
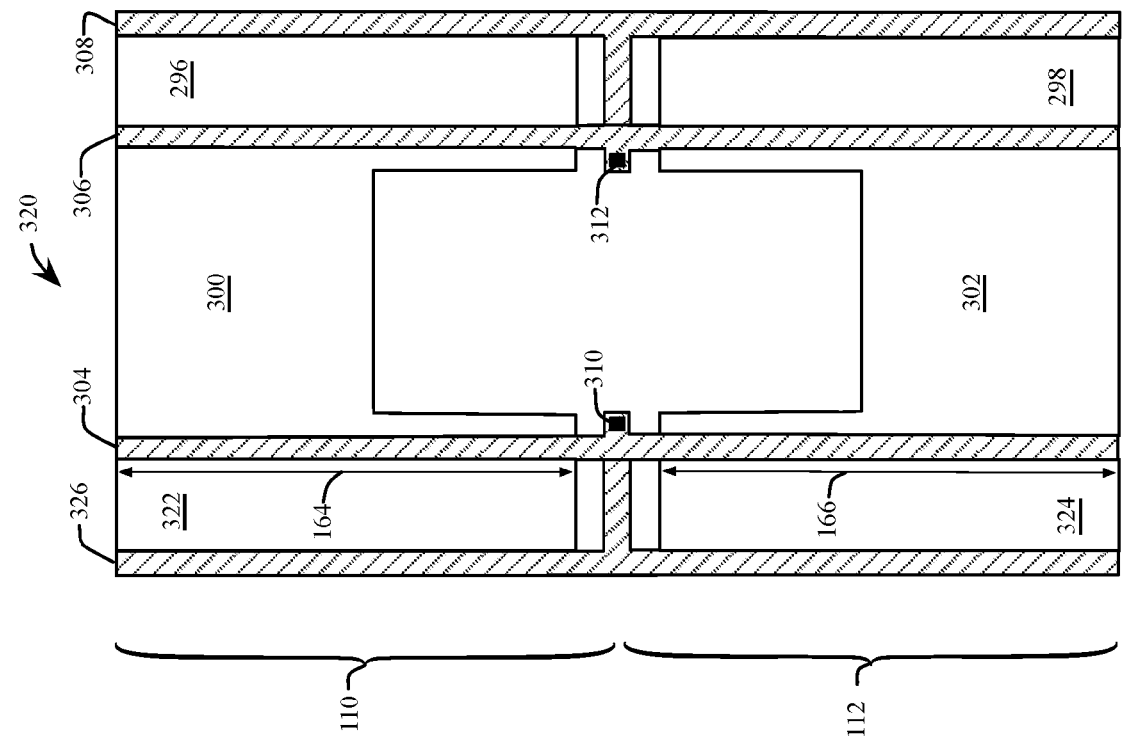
FIG. 10 is another example embodiment of a first metal layer and a gate corresponding to one pair of the transistor fingers of FIG. 8.

FIG. 10 with reference to FIG. 2, FIG. 3, FIG. 4 and FIG. 8 shows a plan view of an example embodiment 320 including a first metal layer and a gate metal of a modification to the third transistor finger 272 as shown in the dotted area 286 of FIG. 8. In the embodiment 320, a first drain region 322 and a second drain region 324 are interposed between the gate 304 and a gate 326. In the example embodiment 320, each gate pad (e.g., gate pad 130c of FIG. 4) can replace both adjacent gate pads (e.g., gate pads 130b and 130d of FIG. 4), thereby increasing the spacing of wire bonds and/or simplifying the assembly process.

Figure 11:
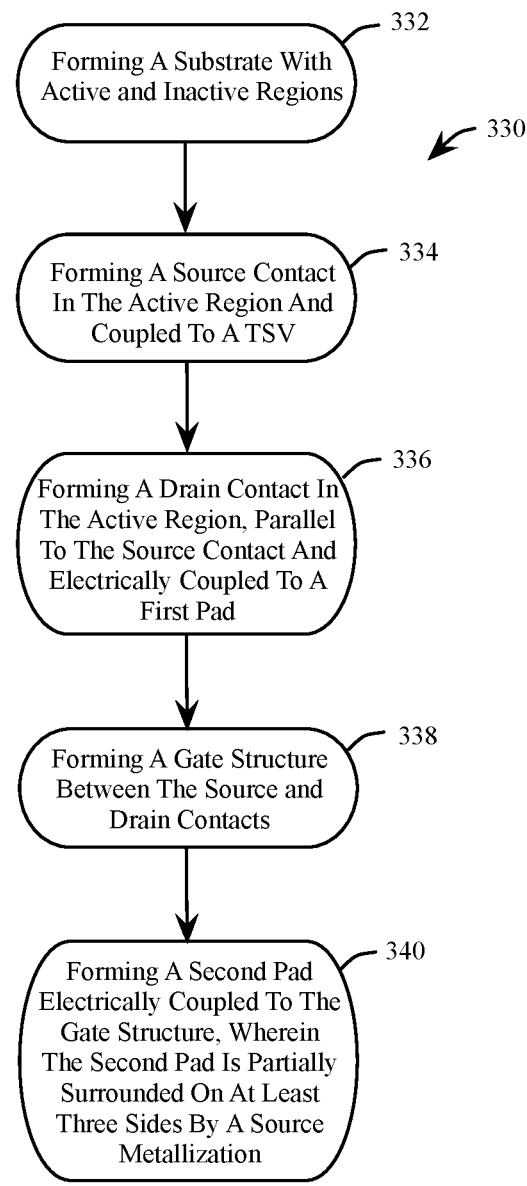
FIG. 11 is a flowchart representation of a method for fabricating a center fed gate for a transistor, in accordance with an example embodiment of the present disclosure.

FIG. 11 shows an example embodiment of a method 330 for fabricating a center fed gate for a transistor. With reference to FIG. 11 and FIG. 1 through FIG. 3, at 332, a substrate is formed with active and inactive regions. For example, the substrate 40 and subsequent epitaxial layers 42, 44 and 46 begin as an active region, where regions are inactivated by implantation as shown by the isolation region 48. At 334, a source contact 16 is formed in the active region and connected to a TSV (each TSV including an insulator 18 surrounding a conductor 20). At 336, a drain contact 14 is formed parallel to the source contact 16 and electrically coupled to a first drain pad 12. At 338, a gate 24 is formed between the source 16 and drain 14 contacts. At 340, a second pad 22 is electrically coupled to the gate 24, where the second pad 22 may be at least partially surrounded on at least two sides by the source metallization 17.

As will be appreciated, embodiments as disclosed include at least the following. In one embodiment, a transistor comprises a semiconductor substrate having a first top surface, a bottom surface opposite the first top surface, a first side and a second side of the first top surface, wherein the first side is opposite the second side. A build-up structure is overlying the first top surface of the semiconductor substrate, and comprising a second top surface. A first pad is exposed at the second top surface. A source contact extends between the first and second sides, wherein the source contact is coupled to a Through-Substrate Via (TSV) that extends through the semiconductor substrate, the source contact in an active region and having a first end proximate to the first side and a second end proximate to the second side. A drain contact extends between the first and second sides in parallel with the source contact, wherein the drain contact is electrically coupled to the first pad, the drain contact is in the active region and has a third end proximate to the first side and a fourth end proximate to the second side. A first gate structure is in the active region and coupled to the first top surface, between the source contact and the drain contact. A second pad is exposed at the second top surface and electrically coupled to the first gate structure, the second pad located between the first and second ends of the source contact.

Alternative embodiments of the transistor include one of the following features, or any combination thereof. The second pad is not over the active region. The source contact proximal to the first portion of the fifth side is shunted with each of a plurality of metal interconnect layers. The drain contact further comprises a first drain contact connected to a second drain contact by a metal conductor, wherein the first gate structure extends a first length of the first drain contact and extends a second length of the second drain contact. The first length equals the second length. The second pad is configured to receive a wire bond. The fifth side of the second pad is connected to the first gate structure and the sixth side of the second pad is connected to a second gate structure. The second pad is connected to a second gate structure, wherein the drain contact is interposed between the first gate structure and the second gate structure.

In another embodiment, a method for fabricating a transistor with a center fed gate comprises forming a semiconductor substrate comprising an active region and an inactive region. A source contact is formed coupled to a Through-Substrate Via (TSV) that extends through the semiconductor substrate, the source contact in the active region and comprising a first elongated shape. A first drain contact is formed in the active region, wherein the drain contact electrically couples to a first pad, the first drain contact comprising a second elongated shape extending parallel to the first elongated shape of the source contact. A first gate structure is formed interposed between the source contact and the first drain contact. A second pad is formed electrically coupled to the first gate structure, the second pad comprising a first side diametrically opposed to a second side, and a third side interposed therebetween, the source contact proximal to the third side, a first portion of the first side and a second portion of the second side.

Alternative embodiments of the method for fabricating a transistor with a center fed gate include one of the following features, or any combination thereof. The second pad is formed over the inactive region. The source contact proximal to the first portion of the first side is shunted with each of a plurality of metal interconnect layers. Forming the drain contact further comprises forming a first drain contact connected to a second drain region by a metal conductor, wherein the first gate structure extends a first length of the first drain contact and a second length of the second drain contact. The first length equals the second length. A wire bond is attached to the second pad. The second pad is connected to the first gate structure on a first side of the second pad, and to a second gate structure on a second side of the second pad. The second pad is connected to a second gate structure, wherein the first drain contact is interposed between the first gate structure and the second gate structure.

In another embodiment, a transistor comprises a semiconductor substrate comprising an active region and an inactive region. A first contact corresponds to one of a transistor source contact and a transistor drain contact, the first contact connected to a Through-Silicon Via (TSV) that extends through the semiconductor substrate, the first contact in the active region and comprising a first elongated shape. A second contact is in the active region, corresponding to another one of the transistor source contact and the transistor drain contact, the second contact different than the first contact, the second contact electrically coupled to a first pad and comprising a first portion connected to a second portion by a metal conductor, the second contact comprising a second elongated shape extending parallel to the first elongated shape of the first contact. A gate structure is interposed between the first contact and the second contact, wherein the gate structure extends a first length of the first portion of the first contact and extends a second length of the second portion of the second contact. A second pad is electrically coupled to the gate structure, the second pad comprising a first side diametrically opposed to a second side, and a third side interposed therebetween, the first contact proximal to the third side, a first portion of the first side and a second portion of the second side.

Alternative embodiments of the transistor include one of the following features, or any combination thereof. The first contact is the transistor source contact and the second contact is the transistor drain contact. The second pad is over the inactive region. The first contact proximal to the first portion of the first side is shunted with each of a plurality of metal interconnect layers.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A transistor comprising:
   a semiconductor substrate having a first top surface, a bottom surface opposite the first top surface, a first side and a second side of the first top surface, wherein the first side is opposite the second side;
   a build-up structure overlying the first top surface of the semiconductor substrate, and comprising a second top surface;
   a first pad exposed at the second top surface;
   a source contact extending between the first and second sides, wherein the source contact is coupled to a Through-Substrate Via (TSV) that extends through the semiconductor substrate, the source contact in an active region and having a first end proximate to the first side and a second end proximate to the second side;
   a drain contact extending between the first and second sides in parallel with the source contact, wherein the drain contact is electrically coupled to the first pad, the drain contact in the active region and having a third end proximate to the first side and a fourth end proximate to the second side;
   a first gate structure in the active region and coupled to the first top surface, between the source contact and the drain contact; and
   a second pad exposed at the second top surface and electrically coupled to the first gate structure, the second pad located between the first and second ends of the source contact.

2. The transistor of claim 1 wherein the second pad is not over the active region.

3. The transistor of claim 1 wherein the source contact is proximal to the first portion of the fifth side is shunted with each of a plurality of metal interconnect layers.

4. The transistor of claim 1 wherein the drain contact further comprises a first drain contact connected to a second drain contact by a metal conductor, wherein the first gate structure extends a first length of the first drain contact and extends a second length of the second drain contact.

5. The transistor of claim 4 wherein the first length equals the second length.

6. The transistor of claim 1 wherein the second pad is configured to receive a wire bond.

7. The transistor of claim 1 wherein the second pad is connected to the first gate structure and to a second gate structure.

8. The transistor of claim 1 further comprising a connection from the second pad to a second gate structure, wherein the drain contact is interposed between the first gate structure and the second gate structure.

9. The transistor of claim 1, wherein a gap is present in the source contact between the first and second ends of the source contact, and the second pad is electrically coupled to the first gate structure through a conductive extension that extends over the gap.

10. A method for fabricating a transistor comprising:
forming a semiconductor substrate comprising an active region and an inactive region;
forming a source contact, and coupling the source contact to a Through-Substrate Via (TSV) that extends through the semiconductor substrate, the source contact in the active region and comprising a first elongated shape;
forming a first drain contact in the active region, wherein the first drain contact is electrically coupled to a first pad, the first drain contact comprising a second elongated shape extending parallel to the first elongated shape of the source contact;
forming a first gate structure interposed between the source contact and the first drain contact; and
forming a second pad electrically coupled to the first gate structure, the second pad comprising a first side diametrically opposed to a second side, and a third side interposed therebetween, the source contact proximal to the third side, a first portion of the first side and a second portion of the second side.

11. The method of claim 10 further comprising forming the second pad over the inactive region.

12. The method of claim 10 further comprising shunting the source contact proximal to the first portion of the first side with each of a plurality of metal interconnect layers.

13. The method of claim 10 wherein forming the drain contact further comprises forming a first drain contact connected to a second drain contact by a metal conductor, wherein the first gate structure extends a first length of the first drain contact and a second length of the second drain contact.

14. The method of claim 13 wherein the first length equals the second length.

15. The method of claim 10 further comprising attaching a wire bond to the second pad.

16. The method of claim 10 further comprising connecting the second pad to the first gate structure on a first side of the second pad, and to a second gate structure on a second side of the second pad.

17. The method of claim 10 further comprising connecting the second pad to a second gate structure, wherein the first drain contact is interposed between the first gate structure and the second gate structure.

18. A transistor comprising:
a semiconductor substrate comprising an active region and an inactive region;
a first contact corresponding to one of a transistor source contact and a transistor drain contact, the first contact connected to a Through-Silicon Via (TSV) that extends through the semiconductor substrate, the first contact in the active region and comprising a first elongated shape;
a second contact in the active region, corresponding to another one of the transistor source contact and the transistor drain contact, the second contact different than the first contact, the second contact electrically coupled to a first pad and comprising a first portion connected to a second portion by a metal conductor, the second contact comprising a second elongated shape extending parallel to the first elongated shape of the first contact;
a gate structure interposed between the first contact and the second contact, wherein the gate structure extends a first length of the first portion of the second contact and extends a second length of the second portion of the second contact; and
a second pad electrically coupled to the gate structure, the second pad comprising a first side diametrically opposed to a second side, and a third side interposed therebetween, the first contact proximal to the third side, a first portion of the first side and a second portion of the second side.

19. The transistor of claim 18 wherein the first contact is the transistor source contact and the second contact is the transistor drain contact.

20. The transistor of claim 18 wherein the second pad is over the inactive region.

21. The transistor of claim 18 wherein the first contact proximal to the first portion of the first side is shunted with each of a plurality of metal interconnect layers.

* * * * *